(12) United States Patent  
Park

(10) Patent No.: US 6,652,648 B2  
(45) Date of Patent: Nov. 25, 2003

(54) METHOD FOR FABRICATING GAN SINGLE CRYSTAL SUBSTRATE

(75) Inventor: Sung-soo Park, Kyungki-do (KR)

(73) Assignee: Samsung Corning Co., Ltd. (KR)

( * ) Notice: Subject to any disclaimer, the term of this patent is extended or adjusted under 35 U.S.C. 154(b) by 0 days.

(21) Appl. No.: 09/841,084

(22) Filed: Apr. 25, 2001

(65) Prior Publication Data

US 2001/0049201 A1 Dec. 6, 2001

(30) Foreign Application Priority Data

Apr. 27, 2000 (KR) ........................................ 2000-22468  
Jun. 5, 2000 (KR) ........................................ 2000-30797

(51) Int. Cl.$^7$ .............................................. G30B 28/08
(52) U.S. Cl. .......................................... 117/90; 117/915
(58) Field of Search ........................ 438/46, 758, 458, 438/459, 798, 977, 479; 117/90, 915

(56) References Cited

U.S. PATENT DOCUMENTS 4,751,554 A * 6/1988 Schnable et al.  
5,306,662 A * 4/1994 Nakamura et al.  
6,265,322 B1 * 7/2001 Anselm et al. ............. 438/745

OTHER PUBLICATIONS

Michael K. Kelly, "Large Free–Standing GaN Substrate by Hydride Vapor Phase Epitaxy and Laser–Induced Liftoff", Jpn. J. Appl. Phys. vol. 38, (1999) pp. L217–L219.  
W. S. Wong, "Damage–free separation of GaN thin films from sapphire substrates", Appl. Phys. Letter, vol. 72, (1998) pp. 599–601.

* cited by examiner

Primary Examiner—Olik Chaudhuri  
Assistant Examiner—Khiem Nguyen  
(74) Attorney, Agent, or Firm—Burns, Doane, Swecker & Mathis, L.L.P.

(57) ABSTRACT

A method for fabricating a gallium nitride single crystal substrate is provided. The method involves: forming a GaN layer on the front side of a sapphire substrate; heating the sapphire substrate at a temperature of 600–1,000° C.; and separating the GaN layer from the sapphire substrate by radiating a laser onto the back side of the sapphire substrate. Before or after forming the GaN layer on the front side of the sapphire substrate, a silicon oxide layer may be formed on the back side of the sapphire substrate. In this case, the silicon oxide layer is removed from the back side of the sapphire substrate in a subsequent process. A high-quality GaN substrate having no crack is attained by the method.

17 Claims, 2 Drawing Sheets

METHOD FOR FABRICATING GAN SINGLE CRYSTAL SUBSTRATE

This application claims priority under 35 U.S.C. §§119 and/or 365 to 00-22468 and 00-30797 filed in Republic of Korea on Apr. 27 and Jun. 5, 2000; the entire content of which is hereby incorporated by reference.

BACKGROUND OF THE INVENTION

1. Field of the Invention

The present invention relates to a method for fabricating a gallium nitride (GaN) single crystal substrate, and more particularly, to a method for fabricating a GaN single crystal substrate, in which occurrence of cracks during separation of the GaN single crystal substrate from a sapphire substrate can be suppressed.

2. Description of the Related Art

Galium nitride (GaN), which has a large direct energy band gap of 3.39 eV, is known as a useful compound semiconductor for use in the manufacture of light emitting diode (LED) which emits a short wavelength light. Due to high vapor pressure of nitrogen at the melting temperature of GaN, liquid phase crystal growth needs high temperature (above 1,500° C.) and high nitrogen pressure (exceeding 20,000 atmospheres) conditions, which makes this a non-viable mass production process. The resultant single crystalline GaN substrate is formed as a plate having a dimension of about 100 mm$^2$, so that it is unsuitable to be used in the manufacture of a variety of devices.

A vapor phase growth technique using an alternative substrate (hetero-epitaxy), such as metal organic chemical vapor deposition (MOCVD) or hydride vapor phase epitaxy (HVPE), has been attempted to form a GaN substrate. As the alternative substrate, a sapphire substrate has been most frequently used because it has a hexagonal structure, like GaN, and is stable at high temperatures. Also, the sapphire substrate is cheap. However, due to the differences in lattice parameter (about 16%) and thermal expansion coefficient (about 35%) from GaN, a strain occurs at the interface between the GaN layer and the sapphire substrate, which causes defects and cracks to occur in the crystalline structure. As a result, it is difficult to grow high-quality GaN layer, and lifetime of a device formed on the GaN layer grown on the sapphire substrate becomes short. If a stress applied to the sapphire substrate and the GaN layer is isotropic, and if the stress exerted upon the sapphire substrate by the GaN layer is smaller than the yield point, the substrates are bent rather than cracked, so the side of the sapphire substrate is concave. As the thickness of the GaN layer increases, the curvature radius from the bending becomes smaller. In addition, the surface of the resultant GaN layer is rough, so that there is a difficulty in processing the surface of the GaN layer. The sapphire substrate and the GaN layer are tilted 30° each other at the interface, so that cutting a device and manufacture of a resonator from the substrates are also difficult. To solve these problems, there is a need for a reliable method for fabricating a free-standing GaN substrate.

When a GaN layer is separated from a sapphire substrate, a mechanical process with diamond powder or a chemical etching technique has been applied. The mechanical process has a problem of cracking of the GaN layer. When the GaN is grown before the polishing, the stress applied to the sapphire substrate on which the GaN layer is grown is less than or equal to that which causes the strain to surpass the yield strength, so that bending rather than cracking occurs. However, as the sapphire substrate becomes thin by polishing, the balance of the strengths is broken, thereby causing cracks to occur in the sapphire substrate, and in turn in the GaN layer. A problem in applying the chemical etching technique lies in that there is no etchant which has a high etch rate and high selectivity with respect to the sapphire substrate.

An alternative approach is to use a laser in separating a GaN layer from a sapphire substrate. The GaN layer is grown on the sapphire substrate by HVPE and separated from the sapphire substrate by radiating a laser beam. The principle of this approach is based on the laser beam transmission and absorption properties of the sapphire substrate and the GaN layer in wavelengths below 365 nm. The side of the sapphire substrate on which the GaN layer is not grown is irradiated by a laser beam, GaN decomposes into Ga and N$_2$ at the interface between the GaN layer and the sapphire substrate, which allows separation of the GaN layer from the sapphire substrate. Use of UV laser in separating a GaN layer from a sapphire substrate is disclosed by M.K. Kelly (Jpn. J. Appl. Phys. Vol. 38, L217, 1999), and W.S. Wong (Appl. Phys. Letter, Vol. 72, pp. 599, 1998). However, these approaches also have many problems.

According to the disclosure by K. K. Kelly, as shown in FIG. 1A, a GaN layer 6 is grown on a sapphire substrate 8 by HVPE, and the GaN layer 6 is fixed to a heater 2 using a metal binder 4. A laser light 9 is radiated onto the sapphire substrate 8 to separate the GaN layer 6 from the sapphire substrate 8. The metal binder 4 is removed from the separated GaN layer 6, thereby resulting in a complete GaN substrate.

According to the disclosure by W. S. Wong, after forming a stack of a sapphire substrate 18, a GaN layer 16, an epoxy adhesive 14, and a silicon substrate 11, a UV laser 19 is radiated onto the sapphire substrate 18 to separate the GaN layer 16 from the sapphire substrate 18. The epoxy adhesive 14 is removed from the separated GaN layer 16, thereby resulting in a GaN substrate.

However, the two methods described above do not involve removing unnecessary polycrystalline GaN layer stuck to the edge or backside of the sapphire substrate before the separation process. Thus, it is difficult to attain a crack-free 2-inch GaN substrate. Also, a 4 mm$^2$ (for the result by W. S. Wong) or 100 mm$^2$ (for the result by M. K. Kelly). Due to such a small crack-free area, the GaN substrates formed by the methods cannot be applied to form a device. In addition, use of the metal binder and epoxy adhesive complicates the overall process.

SUMMARY OF THE INVENTION

It is an object of the present invention to provide a method for fabricating a gallium nitride (GaN) single crystal substrate, in which occurrence of cracks in a GaN layer during separation of the GaN layer from a sapphire substrate is suppressed.

To achieve the object of the present invention, there is provided a method for fabricating a gallium nitride (GaN) single crystal substrate, the method comprising: forming a GaN layer on the front side of a sapphire substrate; heating the sapphire substrate at a temperature of 600–1,000° C.; and separating the GaN layer from the sapphire substrate by radiating a laser beam onto the back side of the sapphire substrate.

It is preferable that the laser has a wavelength of 380 nm or less, and a power of 0.1–0.35 J/cm$^2$.

After forming the GaN layer on the front side of the sapphire substrate, a polycrystalline GaN layer appearing on the back side and edge of the sapphire substrate may be removed. It is preferable that the polycrystalline GaN layer is removed by grinding.

It is preferable that the method for fabricating a gallium nitride (GaN) single crystal substrate further comprises forming a silicon oxide layer on the back side of the sapphire substrate, before forming the GaN layer on the front side of the sapphire substrate, and removing the silicon oxide layer from the back side of the sapphire substrate. It is preferable that the silicon oxide layer has a thickness of 100–1,000 nm. The silicon oxide layer may be removed by wet etching using a hydrofluoric acid (HF).

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 1A:
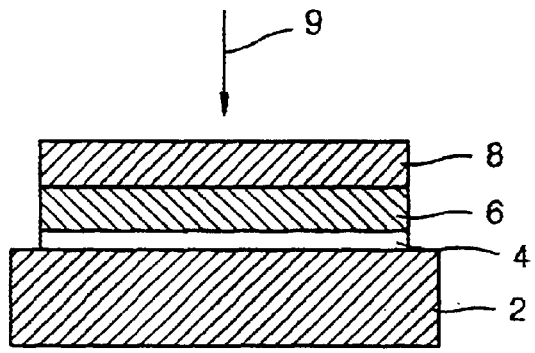
FIGS. 1A and 1B illustrate conventional methods for fabricating a gallium nitride (GaN) single crystal substrate.
Figure 1B:
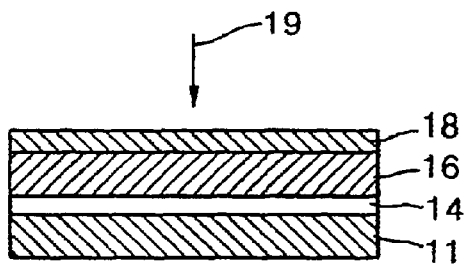
Figure 2:
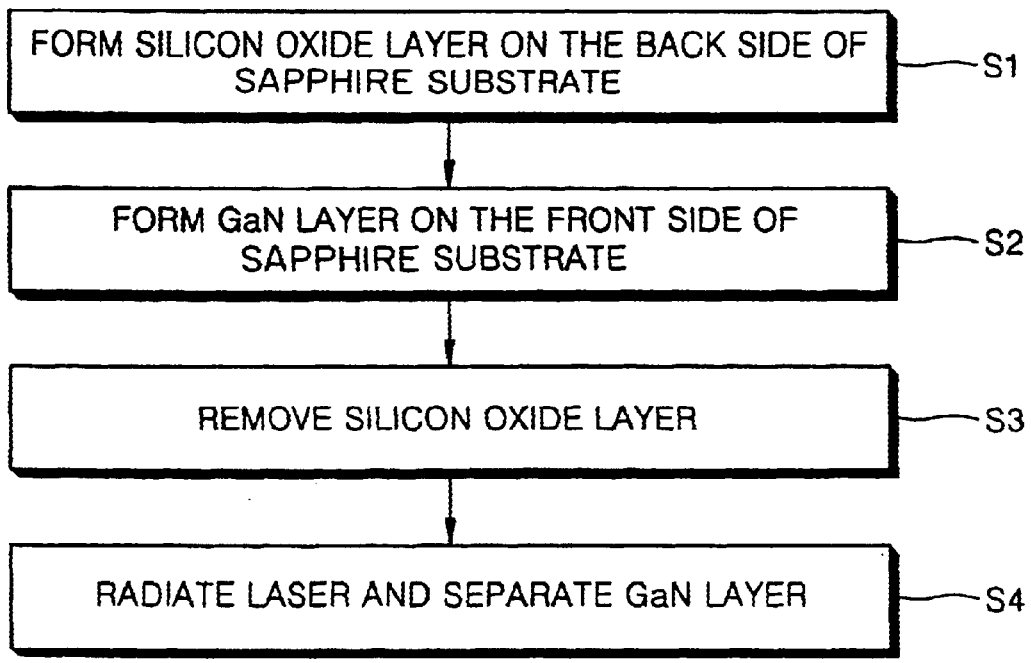
FIG. 2 is a flowchart illustrating a method for fabricating a GaN single crystal substrate according to a preferred embodiment of the present invention.
Figure 3A:
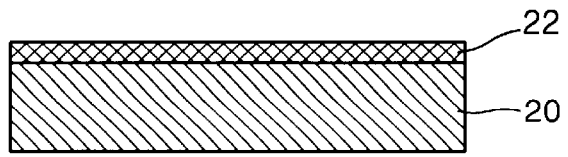
FIGS. 3A through 3D are sectional views illustrating the method for fabricating a GaN single crystal substrate according to the present invention.

A method for fabricating a gallium nitride (GaN) substrate according to a preferred embodiment of the present invention, which is illustrated in FIG. 2, will be described with reference to FIGS. 3A through 3D. As shown in FIG. 3A, a sapphire substrate 20 is cleaned to remove impurities from its surfaces, and a silicon oxide layer 22 is formed on the back side of the sapphire substrate 20 (Step S1 of FIG. 2). The silicon oxide layer 22 is formed to have a thickness of 100–1,000 nm by E-beam or sputtering.

Figure 3B:
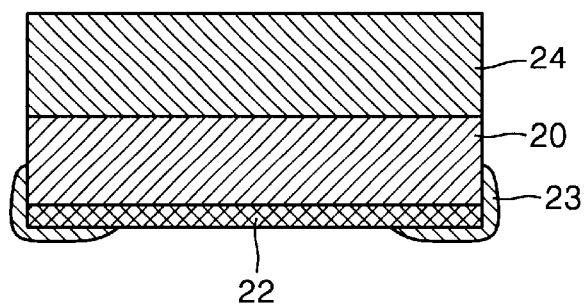

Referring to FIG. 3B, a GaN layer 24 is formed on the front side (mirror side) of the sapphire substrate 20 having the silicon oxide layer 22 (Step S2). The GaN layer 24 is formed by hydride vapor phase epitaxy (HVPE) to have a thickness of 50 μm or more. At this time, a polycrystalline GaN layer 23 is spontaneously formed as a by-product on the edge of the sapphire substrate 20 and on the silicon oxide layer 22. The polycrystalline GaN layer 23 causes a failure in separating the GaN layer 24 from the sapphire substrate 20. The presence of the polycrystalline GaN layer 23 hinders uniform radiation of a laser on the GaN layer though the sapphire substrate 20.

Figure 3C:
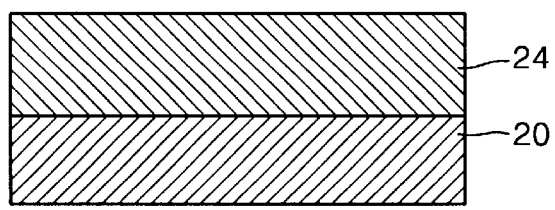

Referring to FIG. 3C, the silicon oxide layer 22 is removed by etching (Step S3). At this time, the polycrystalline GaN layer 23 stuck to the edge and backside of the sapphire substrate 20 and the silicon oxide layer 22 is spontaneously removed during the etching. In particular, the silicon oxide layer 22 is etched by dipping in a hydrofluoric acid (HF) contained in an etching bath. Because the sapphire substrate 20 and the GaN layer 24 are highly resistant to the HF, the sapphire substrate 20 and the GaN layer 24 remain intact during the etching process. The removal of the polycrystalline GaN layer 23 allows radiation of a laser through the sapphire substrate 20 in a subsequent process.

In the present embodiment, as described previously, the silicon oxide layer 22 is formed as a buffer layer for use in the removal of the unnecessary polysilicon GaN layer 23. Instead of forming the buffer layer, the polysilicon GaN layer 23 can be removed by grinding.

Figure 3D:
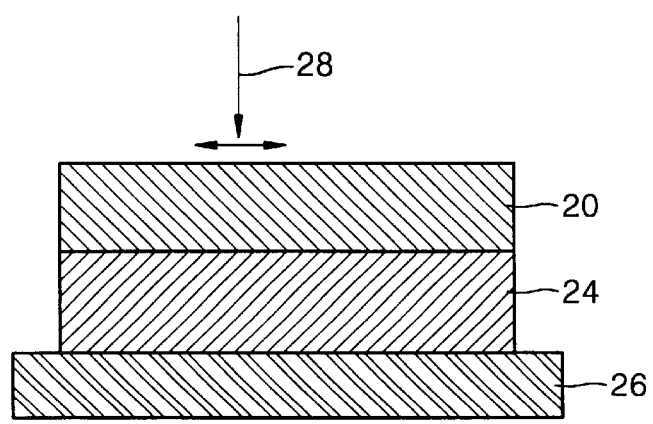

Referring to FIG. 3D, the sapphire substrate 20 is irradiated with a laser 28 to separate the GaN layer 24 from the sapphire substrate 20 (Step S4). In particular, the sapphire substrate 20 with the GaN layer 24 is mounted on a heater 26, such that the GaN layer 24 contacts the surface of the heater 26. After heating at a temperature of 600–1,000° C., the sapphire substrate 20 is irradiated with the laser 28 for a predetermined period of time, and cooled. Here, the rate of heating and cooling the sapphire substrate 20 is maintained in the range of 5–20° C. per minute. The laser 28 decomposes the GaN layer 24 at the interface between the sapphire substrate 20 and the GaN layer 24 into Ga and $N_2$.

Heating the sapphire substrate 20 reduces a strain at the interface between the GaN layer 24 and the sapphire substrate 24, and facilitates decomposition of GaN at the interface. The heating temperature is adjusted in the range of 50–1,000° C.

The entire surface of the sapphire substrate 20, which is fixed to the heater 26, is scanned by the laser 28. Alternatively, a source of the laser 28 may be fixed, and the heater 26 on which the sapphire substrate 20 with the GaN layer 24 is mounted may be rotated or may be reciprocally moved during exposure to the laser 28, such that the entire surface of the sapphire substrate 20 is irradiated by the laser 28. Although the power of the laser 28 is varied depending on the temperature, it is preferable that the laser 28 has a power of 0.1–0.35 $J/cm^2$ in the range of the heating temperature described previously. The laser 28 has a wavelength of 380 nm or less. Preferably, the laser 18 is an ArF eximer laser, KrF eximer laser, XeCl eximer laser, or third harmonic Nd:YAG laser. For a GaN substrate having a diameter of 2 inches, the scanning speed of the laser 28 is in the range of 30–150 mm/min, and the scanning time is about 15 minutes.

As described previously, in the GaN substrate fabricating method according to the present invention, the unnecessary polycrystalline GaN layer 23 appearing on the edge and backside of the sapphire substrate 20 during the formation of the GaN layer 23 on the sapphire substrate 20 is removed before separation of the GaN layer 23 from the sapphire substrate 20. To separate the GaN layer 23 from the sapphire substrate 20, the sapphire substrate 20 is heated at a temperature of 850–1,000° C., and the back side of the sapphire substrate 20 is irradiated by a laser beam, so that the GaN layer 24 can be separated from the sapphire substrate 20 without occurrence of cracking. Comparing with a conventional GaN substrate fabricating method which uses a metal binder or epoxy adhesive to prevent the occurrence of cracking during separation of the GaN substrate, the GaN substrate fabricating method according to the present invention is simple because the GaN layer is separated from the sapphire substrate using just a laser beam. The GaN substrate fabricating method can produce a crack-free high-quality free-standing GaN substrate at low cost, with reliability and reproducibility.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for fabricating a gallium nitride (GaN) single crystal substrate, the method comprising:

forming a silicon oxide layer on the back side of the sapphire substrate;

forming a GaN layer on the front side of a sapphire substrate, after the silicon oxide layer has been formed on the back side of the sapphire substrate;

removing the silicon oxide layer from the back side of the sapphire substrate after the GaN layer on the front side of the sapphire substrate has been formed;

heating the GaN layer formed on the sapphire substrate at a temperature of 600–1,000° C.; and separating the GaN layer from the sapphire substrate by radiating a laser onto the back side of the sapphire substrate.

2. The method of claim 1, wherein, in separating the GaN layer from the sapphire substrate, the back side of the sapphire substrate is scanned by the laser.

3. The method of claim 1, wherein the laser has a wavelength of 380 nm or less.

4. The method of claim 3, wherein the laser has a power of 0.1–0.35 J/cm$^2$.

5. The method of claim 3, wherein the laser is one selected from the group consisting of ArF eximer laser, KrF eximer laser, XeCl eximer laser, and third harmonic Nd:YAG laser.

6. The method of claim 1, wherein the GaN layer is formed by hydride vapor phase epitaxy (HVPE).

7. The method of claim 1, wherein the silicon oxide layer has a thickness of 100–1,000 nm.

8. The method of claim 1, wherein the silicon oxide layer is removed by wet etching using a hydrofluoric acid (HF).

9. A method for fabricating a gallium nitride (GaN) single crystal substrate, the method comprising:

forming a GaN layer on the front side of a sapphire substrate;

heating the GaN layer formed on the sapphire substrate at a temperature of 600–1,000° C.; and separating the GaN layer from the sapphire substrate by radiating a laser onto the back side of the sapphire substrate, wherein, in separating the GaN layer from the sapphire substrate, the back side of the sapphire substrate is scanned by the laser, and wherein the scanning speed of the laser is in the range of 30–150 mm/min.

10. A method for fabricating a gallium nitride (GaN) single crystal substrate, the method comprising:

forming a GaN layer on the front side of a sapphire substrate;

heating the GaN layer formed on the sapphire substrate at a temperature of 600–1,000° C.;

removing a polycrystalline GaN layer appearing on the back side of the sapphire substrate; and separating the GaN layer from the sapphire substrate by radiating a laser onto the back side of the sapphire substrate.

11. The method of claim 10, wherein the polycrystalline GaN layer is removed by grinding.

12. The method of claim 10, wherein, in separating the GaN layer from the sapphire substrate, the back side of the sapphire substrate is scanned by the laser.

13. The method of claim 12, wherein the scanning speed of the laser is in the range of 30–150 mm/min.

14. The method of claim 10, wherein the laser has a wavelength of 380 nm or less.

15. The method of claim 14, wherein the laser has a power of 0.1–0.35 J/cm$^2$.

16. The method of claim 14, wherein the laser is one selected from the group consisting of ArF eximer laser, KrF eximer laser, XeCl eximer laser, and third harmonic Nd:YAG laser.

17. The method of claim 10, wherein the GaN layer is formed by hydride vapor phase epitaxy (HVPE).

* * * * *